US 8,529,185 B2

(12) United States Patent
Hirasawa et al.

(10) Patent No.: US 8,529,185 B2
(45) Date of Patent: Sep. 10, 2013

(54) WORK HANDLING APPARATUS

(75) Inventors: Yoichi Hirasawa, Tokyo (JP); Katsuo Saito, Tokyo (JP); Yoji Shinozaki, Tokyo (JP); Motoyasu Ohata, Tokyo (JP); Toshihiko Watanabe, Tokyo (JP)

(73) Assignee: Hirata Corporation, Tokyo (JP)

( * ) Notice: Subject to any disclaimer, the term of this patent is extended or adjusted under 35 U.S.C. 154(b) by 1034 days.

(21) Appl. No.: 11/990,941

(22) PCT Filed: Aug. 31, 2005

(86) PCT No.: PCT/JP2005/016356
§ 371 (c)(1),
(2), (4) Date: Feb. 25, 2008

(87) PCT Pub. No.: WO2007/026433
PCT Pub. Date: Mar. 8, 2007

(65) Prior Publication Data
US 2009/0148261 A1   Jun. 11, 2009

(51) Int. Cl.
*B65G 1/133* (2006.01)
(52) U.S. Cl.
USPC .................................. 414/749.6; 414/222.03
(58) Field of Classification Search
USPC ............... 414/222.01, 222.02, 222.07, 749.1,
414/935, 940, 416.01, 403, 796.7, 223, 222,
414/225, 778.7, 560, 564, 569, 589, 592,
414/751.1, 749.6, 785, 795.6, 795.7, 788.7,
414/334, 336, 342, 344, 392, 393, 561, 591,
414/222.03, 225.01; 212/167, 324, 251,
212/74, 336, 342, 344
See application file for complete search history.

(56) References Cited

U.S. PATENT DOCUMENTS

| 4,783,904 A | * | 11/1988 | Kimura ........................... 29/786 |
| 4,986,729 A | * | 1/1991 | Ohlenbusch .................. 414/787 |
| 5,307,011 A | * | 4/1994 | Tani ........................... 324/158.1 |

(Continued)

FOREIGN PATENT DOCUMENTS

| JP | 8-334548 | 12/1996 |
| JP | 9-318703 | 12/1997 |
| JP | 2002-174658 | 6/2002 |

OTHER PUBLICATIONS

International Search Report issued Dec. 20, 2005 in the International (PCT) Application of which the present application is the U.S. National Stage.

*Primary Examiner* — James Keenan
*Assistant Examiner* — Glenn Myers
(74) *Attorney, Agent, or Firm* — Wenderoth, Lind & Ponack, L.L.P.

(57) ABSTRACT

A work handling apparatus includes a general-purpose tray holding unit which can move in the left and right direction while holding a general-purpose tray that accommodates works, a processing tray holding unit which is arranged adjacent to the rear side in the front and rear direction of the general-purpose tray holding unit and can move in the left and right direction while holding a processing tray for carrying works in and out of a processing area, and work transfer units which can move in the front and rear direction and the vertical direction so as to transfer works between the general-purpose tray and the processing tray. Thus, the general-purpose tray holding unit and the processing tray holding unit move in the Y direction within the XY plane, and the work transfer units move within the XZ plane, so that the work transfer operation can be increased in speed and the productivity is improved.

16 Claims, 12 Drawing Sheets

(56) References Cited

U.S. PATENT DOCUMENTS

| | | | | |
|---|---|---|---|---|
| 5,443,346 A | * | 8/1995 | Murata et al. | 414/222.13 |
| 5,588,797 A | * | 12/1996 | Smith | 414/797.5 |
| 5,865,319 A | * | 2/1999 | Okuda et al. | 209/574 |
| 5,876,172 A | * | 3/1999 | Di Rosa | 414/139.9 |
| 6,163,145 A | * | 12/2000 | Yamada et al. | 324/750.03 |
| 6,184,675 B1 | * | 2/2001 | Bannai | 324/750.03 |
| 6,190,107 B1 | * | 2/2001 | Lanigan et al. | 414/342 |
| 6,283,695 B1 | * | 9/2001 | Nakagawa et al. | 414/416.05 |
| 6,384,593 B1 | * | 5/2002 | Kobayashi et al. | 324/158.1 |
| 6,439,822 B1 | * | 8/2002 | Kimura et al. | 414/331.04 |
| 6,573,739 B1 | * | 6/2003 | Saito | 324/750.25 |
| 6,758,647 B2 | * | 7/2004 | Kaji et al. | 414/217 |
| 7,268,534 B2 | * | 9/2007 | Kim | 324/158.1 |
| 7,479,779 B2 | * | 1/2009 | Kikuchi et al. | 324/750.23 |
| 2002/0011863 A1 | * | 1/2002 | Takahashi et al. | 324/760 |
| 2002/0062554 A1 | * | 5/2002 | Hwang et al. | 29/832 |
| 2003/0135991 A1 | * | 7/2003 | Nagao et al. | 29/739 |
| 2004/0166689 A1 | * | 8/2004 | Wakabayashi et al. | 438/706 |
| 2005/0158152 A1 | * | 7/2005 | Otaguro | 414/217 |

\* cited by examiner

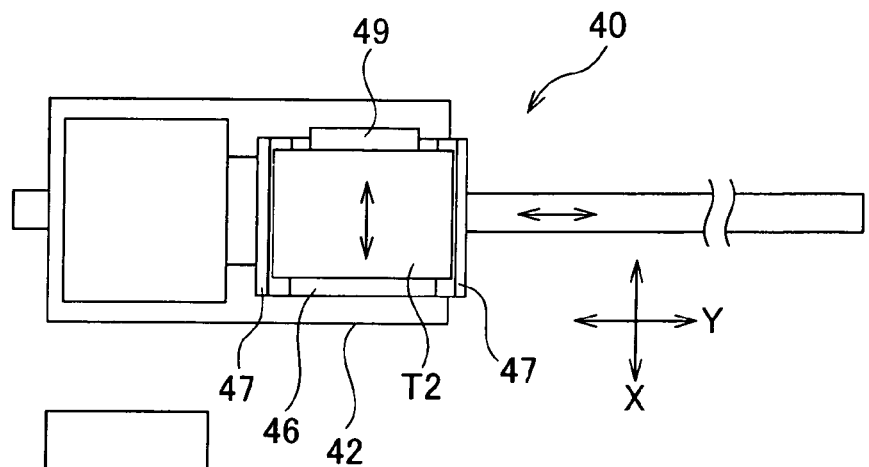
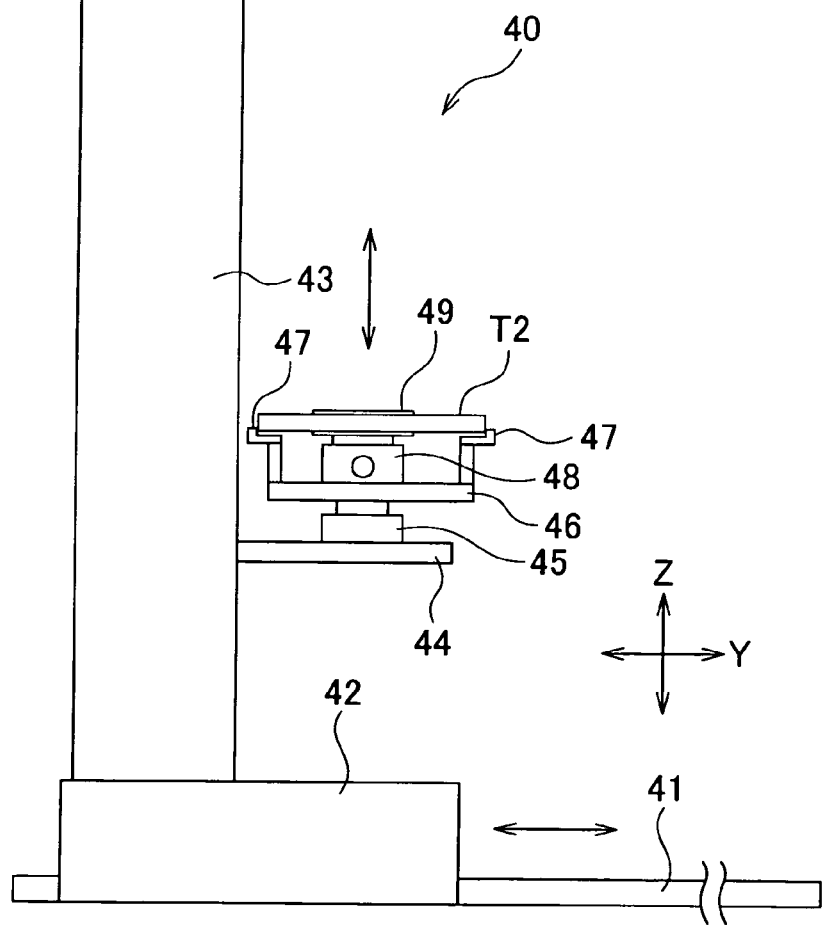
FIG.8A
FIG.8B

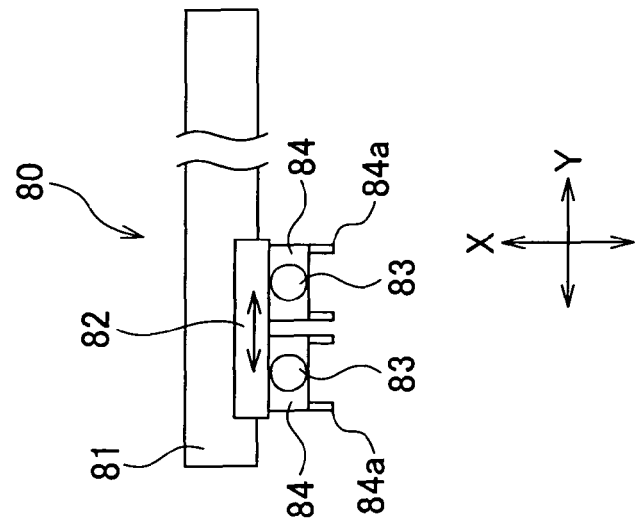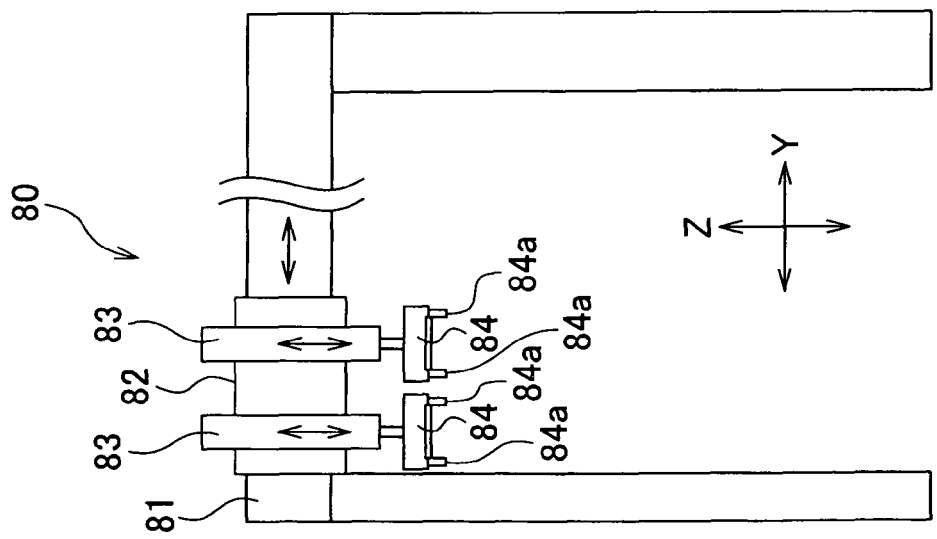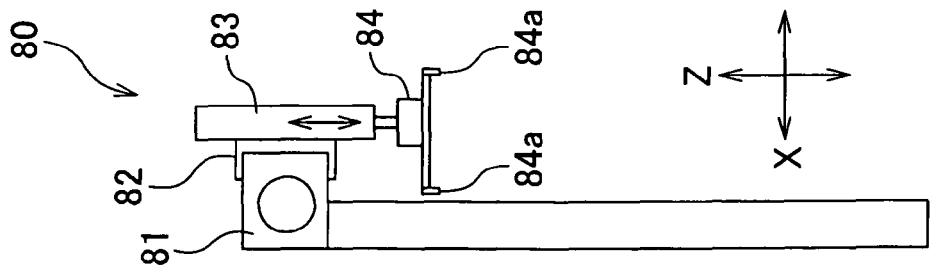

WORK HANDLING APPARATUS

TECHNICAL FIELD

The present invention relates to a work handling apparatus which transfers works between a general-purpose tray for accommodating works such as semiconductor chips for ICs, LSIs, CPUs, or the like or other electronic components and an exclusive processing tray for accommodating works at pitches different from those of the general-purpose tray when processing such as a test, or an inspection is applied to the works, or conveys and positions the general-purpose tray and the processing tray.

BACKGROUND ART

To apply various processing such as a test or an inspection to works such as semiconductor chips, the works are conveyed across a plurality of processes. To efficiently convey the works, a general-purpose tray which accommodates a plurality of works at a time is used.

Specifically, a plurality of works are arranged and accommodated in a general-purpose tray, conveyed to various processing steps in order, and in each processing step, the works are taken out one by one or a plurality of works are collectively taken out and subjected to predetermined processing, and the works are returned into the general-purpose tray and conveyed to the next processing step.

Herein, in a processing step for applying predetermined processing such as a test or an inspection, for optimal processing, the works are transferred onto an exclusive processing tray with accommodation pitches different from those of the general-purpose tray and subjected to processing, and works for which the processing was completed are returned into the general-purpose tray and conveyed to the next processing step.

This exclusive processing tray is formed so as to accommodate a plurality of works at accommodation pitches different from the accommodation pitches (intervals) of the general-purpose tray. Therefore, between the general-purpose tray and the processing tray, an operation for transferring the works is necessary.

Thus, as a conventional work handling apparatus which transfers works between a general-purpose tray and a processing tray, one is known which includes two loaders which transfer works from the general-purpose tray onto the processing tray, two unloaders which transfer the works from the processing tray onto the general-purpose tray, wherein the two loaders are provided with changeable mechanisms which can change the pitches of the columns or rows of the works, and the two unloaders are provided with changeable mechanisms which can change the pitches of the columns or rows (for example, refer to Japanese Unexamined Patent Publication No. 2002-174658).

However, in this apparatus, the loaders and the unloaders are provided with changeable mechanisms, and by driving the changeable mechanisms, the pitches of accommodation of the works are adjusted, so that it takes time to change the pitches, and this is not preferable in terms of an increase in speed of the transfer operation. If the changeable mechanisms become complicated, the functional reliability lowers, so that it must be confirmed whether the change to desired pitches was reliably made. Further, the provision of the changeable mechanisms increases the sizes and weights of the loaders and unloaders, and in combination with repeating operations, work holding failures may occur. To handle a small component, stopping accuracy when taking out or placing the component is important, however, if the number of mechanisms for transferring the component is large, mechanical errors occurring in the respective mechanisms accumulate, and the stopping position accuracy when taking out or placing the component is lowered, and a component taking out failure or placing failure may occur.

The present invention was made in view of the above-described circumstances, and an object thereof is to provide a work handling apparatus which can efficiently apply various processing such as tests, inspections, measurements, working, and assembly, etc., to works such as semiconductor chips, substrates, and other electronic components and can improve the productivity while realizing simplification of the structure, consolidation of the mechanisms, downsizing of the entire apparatus, space-saving of installation area, and reduction in time for work transfer.

DISCLOSURE OF THE INVENTION

The work handling apparatus of the present invention which achieves the above-described object includes: a general-purpose tray holding unit which can move in the left and right direction while holding a general-purpose tray which can accommodate works; a processing tray holding unit which is arranged adjacent to the rear side in the front and rear direction of the general-purpose tray holding unit, and can move in the left and right direction while holding the processing tray which carries the works in and out of a processing area; and a work transfer unit which can move in the front and rear direction and the vertical direction so as to transfer works between the general-purpose tray and the processing tray.

With this constitution, when an unprocessed work is transferred from a general-purpose tray onto a processing tray, and when a processed work for which predetermined processing has been completed is transferred from a processing tray onto a general-purpose tray, the general-purpose tray holding unit and the processing tray holding unit are moved in the left and right direction arbitrarily according to predetermined accommodation pitches and positioned at a predetermined taking out position and accommodating position, and the work transfer unit moves in the front and rear direction to convey works between the general-purpose tray and the processing tray and moves in the vertical direction to take-out works and accommodate the works, and transfers the works between the general-purpose tray and the processing tray.

Thus, the general-purpose tray holding unit and the processing tray holding unit move in the left and right direction arbitrarily and a work to be taken out and accommodated is always positioned below the work transfer unit in the left and right direction, and the work transfer unit moves in the vertical direction and the front and rear direction to transfer the work, so that the work can be moved at a high speed, and a higher speed of the transfer operation can be realized. In addition, as the general-purpose tray holding unit, the processing tray holding unit, and the work transfer unit, one moving mechanism which moves in one direction within a plane (the left and right direction Y or the front and rear direction X) is employed, so that when the work is transferred between the general-purpose tray and the processing tray, a mechanical error is decreased and the stop position accuracy is improved. As a result, even a small work can be accurately taken out and transferred.

In the apparatus constituted as described above, a constitution can be employed in which a processing tray delivery unit that delivers the processing tray is disposed between a processing tray holding unit and the processing area.

With this constitution, the processing tray is delivered between the processing tray holding unit and the processing area by the processing tray delivery unit, so that smooth transition to a processing step after the work transfer step is possible, and a processed work can be smoothly returned to the processing tray holding unit, and further, when a plurality of processing areas are provided, the processing tray can be transferred between an arbitrarily selected processing area and the processing tray holding unit.

In the apparatus constituted as described above, a constitution can be employed in which a plurality of work transfer units are provided and arranged in the left and right direction, and the general-purpose tray holding unit holds a plurality of general-purpose trays, and the plurality of general-purpose trays include a general-purpose unprocessed work tray which accommodates unprocessed works and a general-purpose processed work tray which accommodates processed works.

With this constitution, for example, when two work transfer units are provided, while an unprocessed work is transferred from a general-purpose unprocessed work tray onto a processed work tray by one work transfer unit, a processed work can be transferred onto the general-purpose processed work tray from the processed work tray by the other work transfer unit. That is, transfer of the unprocessed work and transfer of the processed work can be performed at the same time, so that the time necessary for transfer can be made shorter than in the case where the unprocessed and processed works are transferred at different times.

In the apparatus constituted as described above, a constitution can be employed in which the processing area includes an inspection area in which a predetermined inspection is applied to the work, and the general-purpose processed work tray includes a general-purpose non-defective tray for accommodating works satisfying the predetermined inspection and a general-purpose defective tray for accommodating works that do not satisfy the predetermined inspection.

With this constitution, after a predetermined inspection is applied to the works, the processing tray is delivered from the inspection area to the processing tray holding unit by the processing tray delivery unit, and by the work transfer unit, non-defective works are classified and transferred from the processing tray onto the general-purpose non-defective tray and defective works are classified and transferred from the processing tray onto the general-purpose defective tray. Thus, inspected works can be efficiently classified into non-defectives and defectives concurrently with the transfer operation, and the steps as a whole can be simplified.

In the apparatus constituted as described above, a constitution can be employed in which the general-purpose tray holding unit is formed to be movable in the front and rear direction between a rear position at which a work is transferred by the work transfer unit and a front position for supplying or retrieving the general-purpose tray, and at the further front side of the general-purpose tray holding unit in the front and rear direction, a general-purpose tray supplying unit which supplies a general-purpose tray accommodating works and an empty general-purpose tray that does not accommodates works, a general-purpose tray retrieving unit which retrieves a general-purpose tray held by the general-purpose tray holding unit, and a general-purpose tray transfer unit which transfers a general-purpose tray between the general-purpose tray supplying unit and the general-purpose tray holding unit and between the general-purpose tray holding unit and the general-purpose tray retrieving unit, are provided.

With this constitution, when the general-purpose tray holding unit moves to the front position, by the general-purpose tray transfer unit, a general-purpose tray accommodating works or an empty general-purpose tray is supplied from the general-purpose tray supplying unit to the general-purpose tray holding unit, and a general-purpose tray is retrieved from the general-purpose tray holding unit to the general-purpose tray retrieving unit. Thus, supply and retrieval of the general-purpose tray can be efficiently performed in a sequential flow of operations.

In the apparatus constituted as described above, a constitution can be employed in which the general-purpose tray transfer unit is formed so as to hold a plurality of general-purpose trays.

With this constitution, a plurality of general-purpose trays (for example, a general-purpose tray accommodating unprocessed works and an empty general-purpose tray that does not accommodate works) can be transferred at the same time by the general-purpose tray transfer unit, and at the transfer position, an operation of transferring a general-purpose tray and an operation of receiving a general-purpose tray accommodating processed works can be performed at the same time, so that the total time necessary for operations can be shortened, and the supply and retrieval of the general-purpose trays can be performed more efficiently.

In the above-described apparatus, a constitution can be employed in which the general-purpose tray supplying unit and the general-purpose tray retrieving unit are arranged in the left and right direction, and the general-purpose tray transfer unit is formed to be movable in the left and right direction and the vertical direction.

With this constitution, when supplying a general-purpose tray, the general-purpose tray transfer unit is moved to one side of the left and right direction, and when retrieving a general-purpose tray, the general-purpose tray transfer unit is moved to the other side of the left and right direction, so that the apparatus can be condensed (integrated) while the movement distance to supply and retrieve general trays (moving path length) is shortened.

In the apparatus constituted as described above, a constitution can be employed in which a general-purpose tray standby area in which general-purpose trays are temporarily on standby is provided in a moving range of the general-purpose tray transfer unit.

With this constitution, when a general-purpose tray accommodating processed works is not filled, the general-purpose trays can be temporarily set on standby in the general-purpose tray standby area, and when an interruption instruction for processing a different type of works is given, a preceding general-purpose tray can be temporarily set on standby in the general-purpose tray standby area, and further, a general-purpose tray to be supplied to the general-purpose tray holding unit or a general-purpose tray to be retrieved from the general-purpose tray holding unit can be temporarily set on standby in the general-purpose tray standby area so that the supplying timing or the retrieving timing is adjusted.

In the apparatus constituted as described above, a constitution can be employed in which a processing tray supplying and retrieving unit which supplies or retrieves a processing tray to or from the processing tray delivery unit is provided.

With this constitution, when a plurality of processing areas are provided, a required number of processing trays can be supplied by the processing tray supplying and retrieving unit, and when a processing area pauses, the processing tray can be retrieved correspondingly. Further, in the case of maintenance and inspection of the processing tray, the processing tray can be easily taken out.

In the apparatus constituted as described above, a constitution can be employed in which a work transfer mechanism is formed by the general-purpose tray holding unit, the processing tray holding unit, and the work transfer unit, and a plurality of work transfer mechanisms are provided and arranged in the left and right direction.

With this constitution, by providing the plurality of work transfer mechanisms each consisting of the general-purpose tray holding unit, the processing tray holding unit, and the work transfer unit, works can be successively transferred in a shorter time, and the total time necessary for handling works can be shortened and the productivity can be improved.

BRIEF DESCRIPTION OF THE DRAWINGS

FIG. 8A and FIG. 8B are a plan view and a front view of a processing tray delivery unit forming a part of the work handling apparatus of FIG. 1, respectively;

FIG. 11A, FIG. 11B, and FIG. 11C are a side view, a front view, and a plan view of a general-purpose tray transfer unit forming a part of the work handling apparatus of FIG. 1, respectively.

DETAILED DESCRIPTION OF THE INVENTION

Hereinafter, an exemplary embodiment of the present invention will be described with reference to the accompanying drawings.

Figure 1:
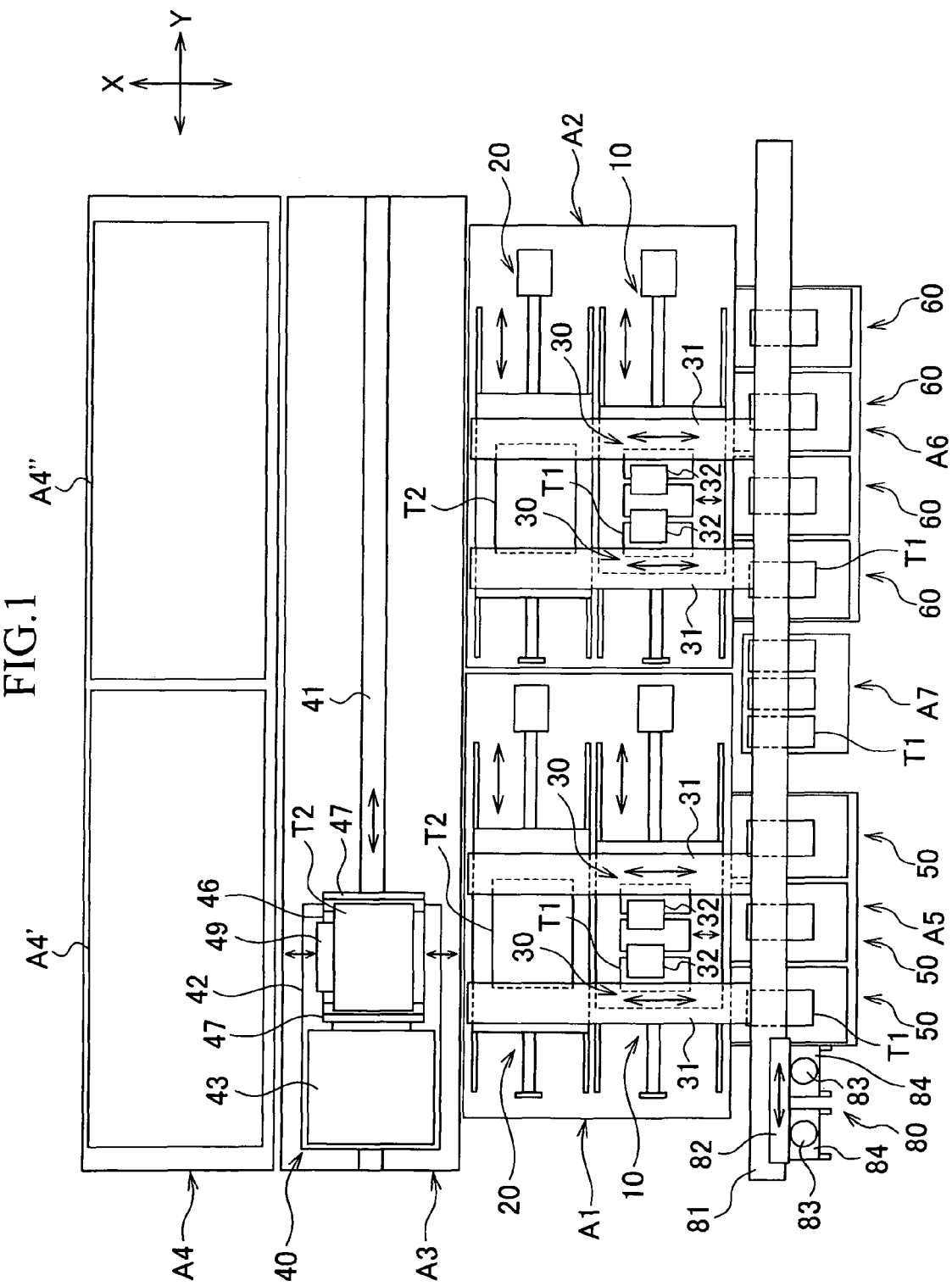
FIG. 1 is a plan view showing an embodiment of a work handling apparatus of the present invention.

This work handling apparatus includes, as shown in FIG. 1, two transfer areas A1 and A2 arranged in the left and right direction Y, a processing tray delivery area A3 disposed adjacent to the rear side of the two transfer areas A1 and A2, a processing area A4 disposed adjacent to the rear side of the processing tray delivery area A3, a general-purpose tray supplying area A5 disposed adjacent to the front side of the transfer area A1, a general-purpose tray retrieving area A6 disposed adjacent to the front side of the transfer area A2, a general-purpose tray standby area A7 which is disposed between the general-purpose tray supplying area A5 and the general-purpose tray retrieving area A6 and in which general-purpose trays are set on standby, and so on.

Figure 4:
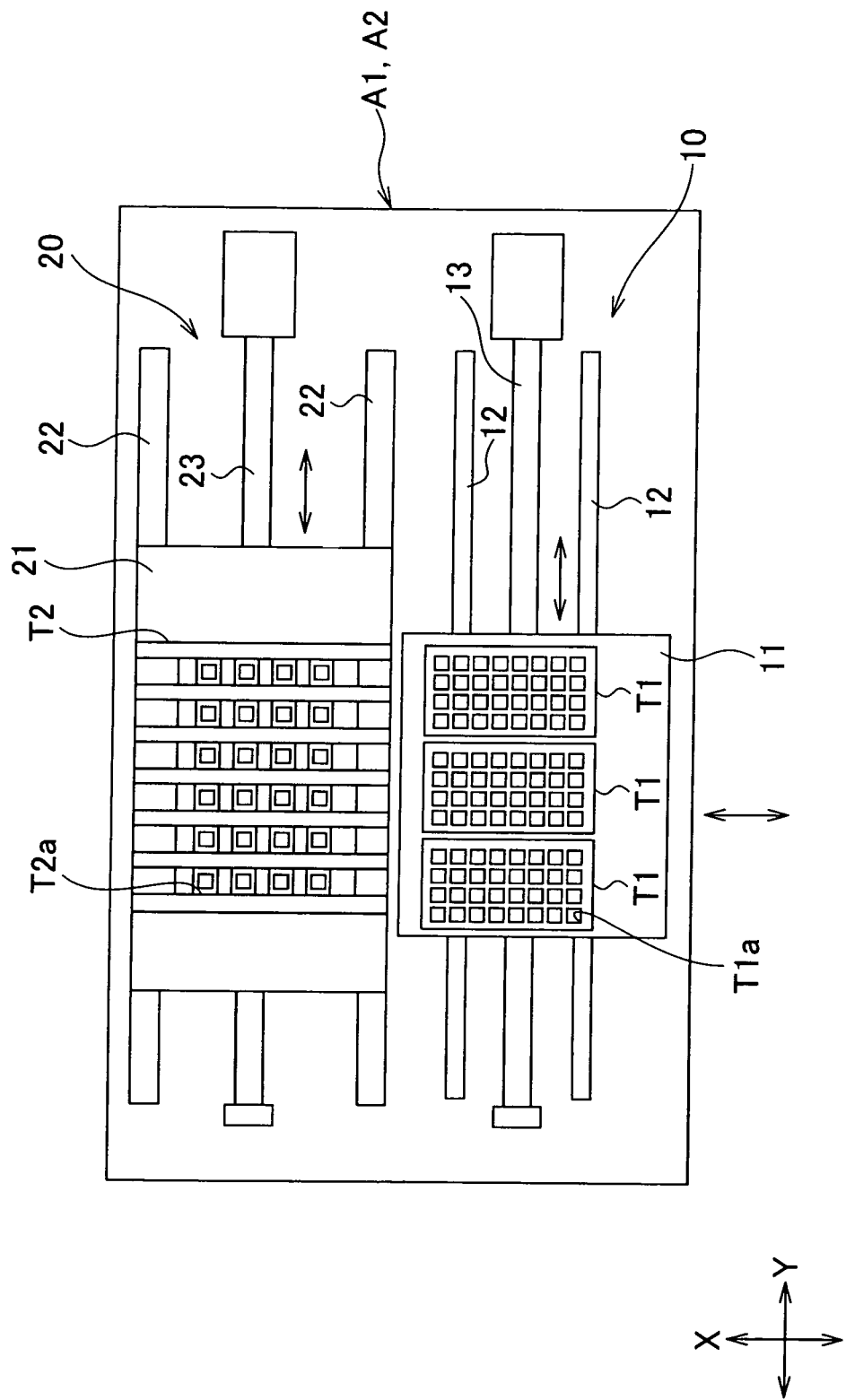
FIG. 4 is a plan view of a general-purpose tray holding unit and a processing tray holding unit forming a part of the work handling apparatus of FIG. 1.
Figure 5:
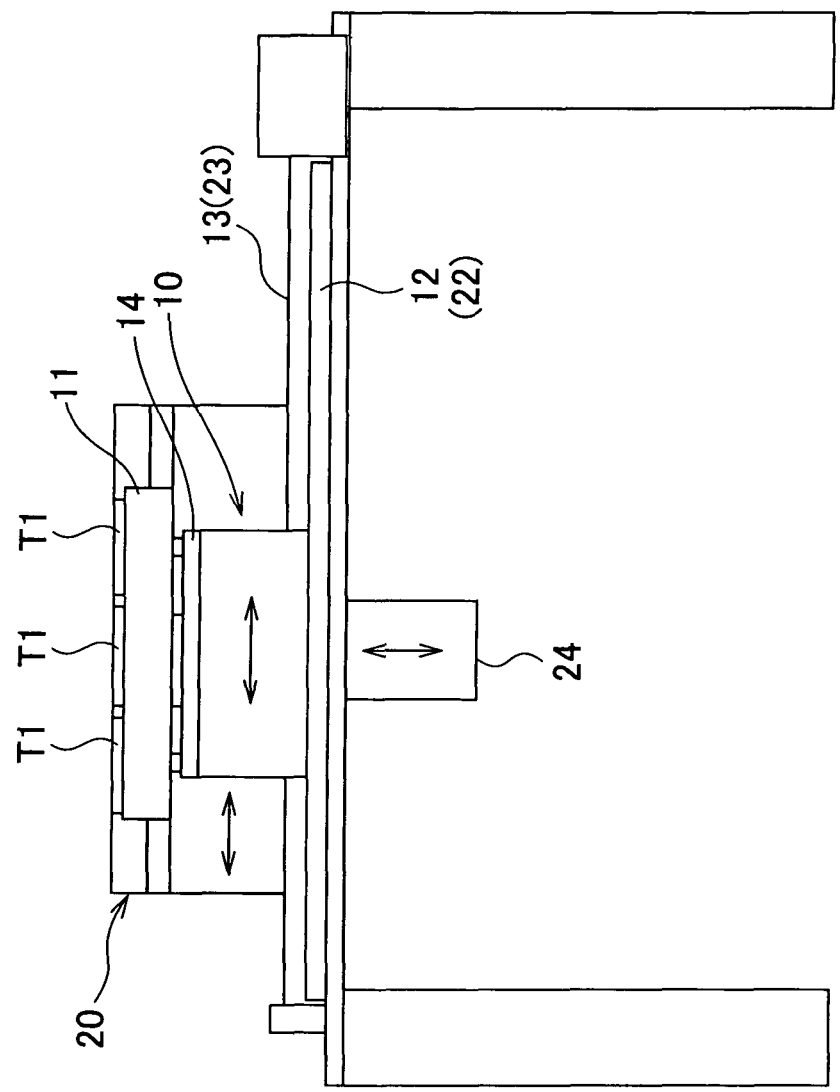
FIG. 5 is a front view of a general-purpose tray holding unit and a processing tray holding unit forming a part of the work handling apparatus of FIG. 1.
Figure 6:
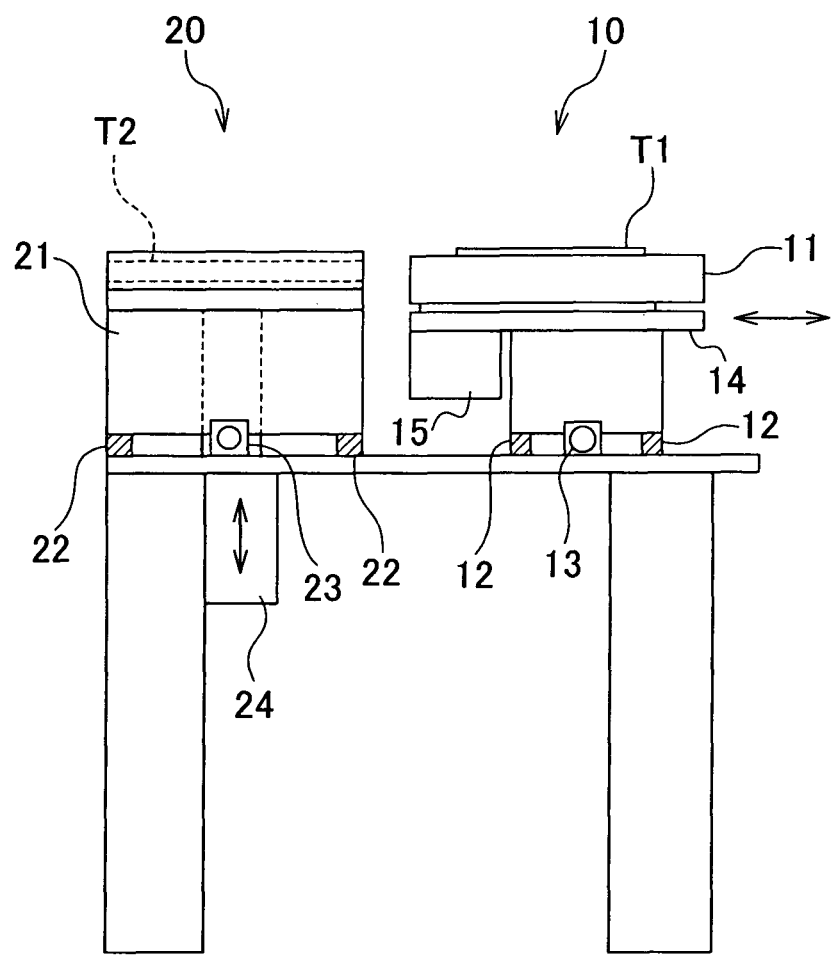
FIG. 6 is a side view of a general-purpose tray holding unit and a processing tray holding unit forming a part of the work handling apparatus of FIG. 1.
Figure 7A:
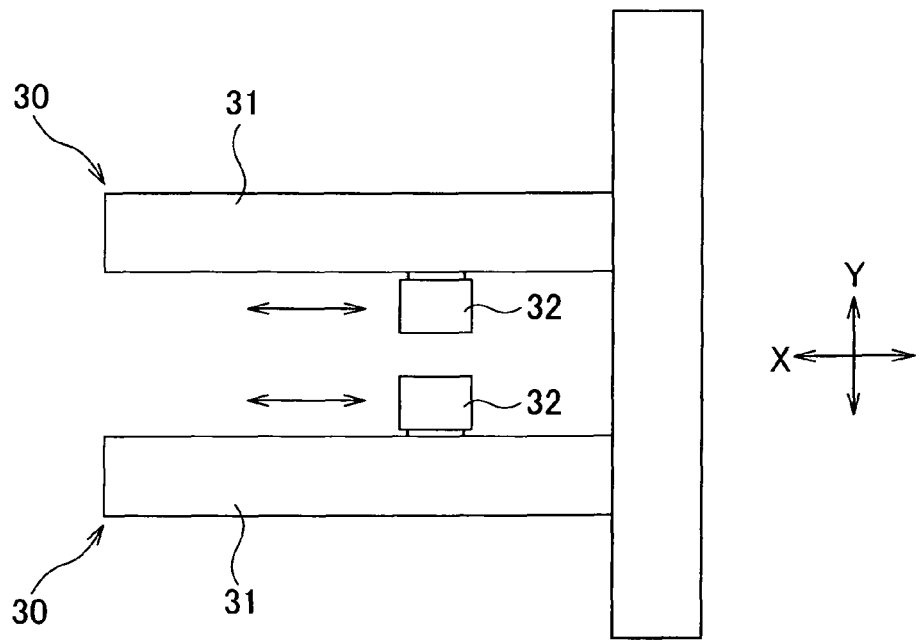
FIG. 7A, FIG. 7B, and FIG. 7C are a plan view, a side view, and a front view of work transfer units forming a part of the work handling apparatus of FIG. 1, respectively.
Figure 7B:
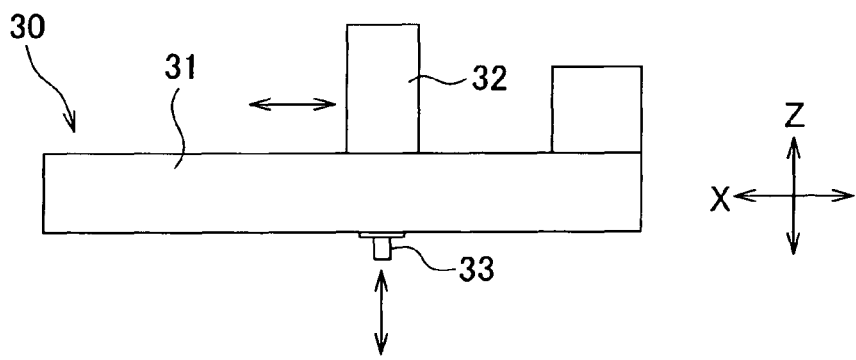
Figure 7C:
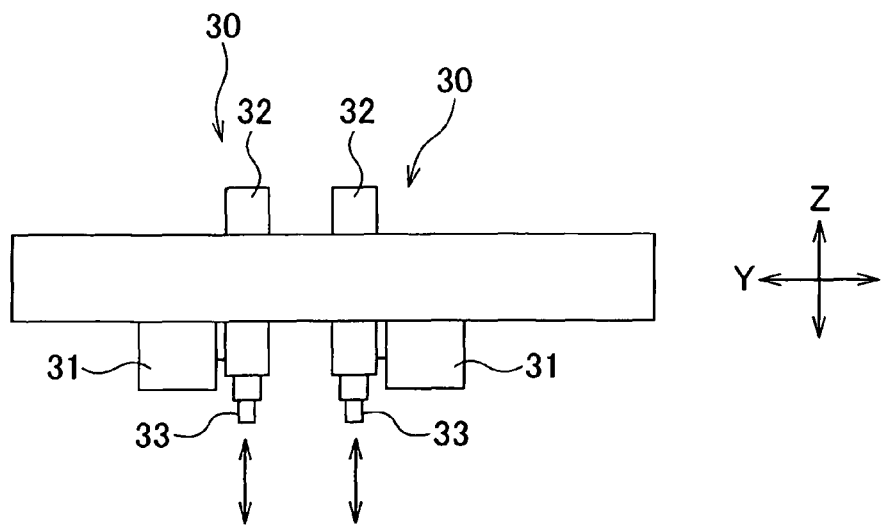

Herein, the general-purpose tray T1 is used for conveying unprocessed works or processed works, and as shown in FIG. 4, includes a plurality of accommodating portions T1a arranged in a grid pattern at predetermined pitches. The general-purpose trays T1 include general-purpose unprocessed work trays T1 for accommodating unprocessed works, general-purpose processed works tray T1 for accommodating processed works, and empty general-purpose trays T1 which have not accommodated works. The general-purpose processed work trays T1 include general-purpose non-defective trays T1 for accommodating works satisfying a predetermined inspection and general-purpose defective trays T1 for accommodating works that do not satisfy the predetermined inspection.

On the other hand, the processing tray T2 is used for carrying unprocessed works or processed works in and out of the processing area A4, and includes, as shown in FIG. 4, a plurality of accommodating portions T2a arranged in a grid pattern at predetermined pitches.

Figure 2:
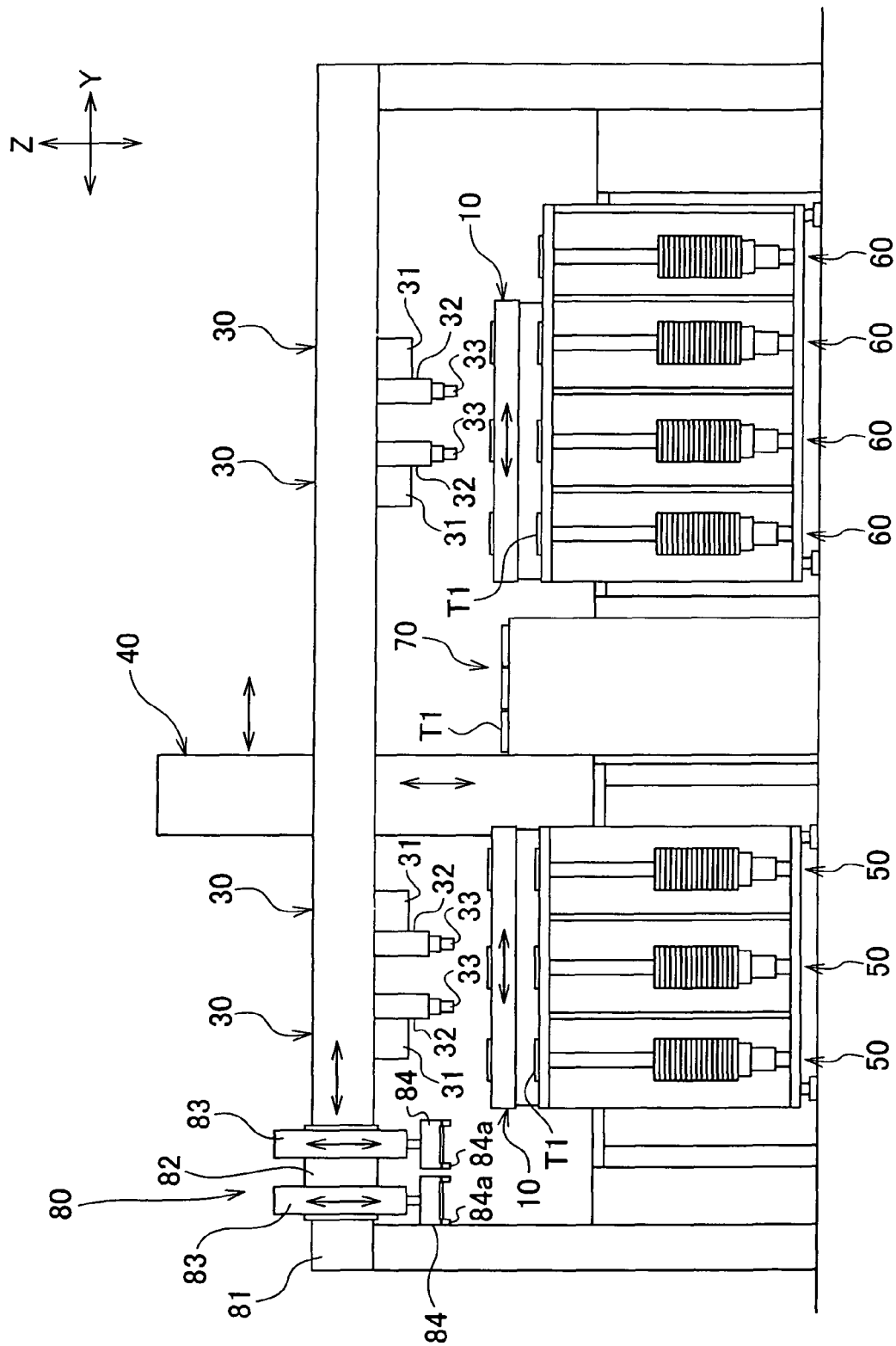
FIG. 2 is a front view of the work handling apparatus of FIG. 1.
Figure 3:
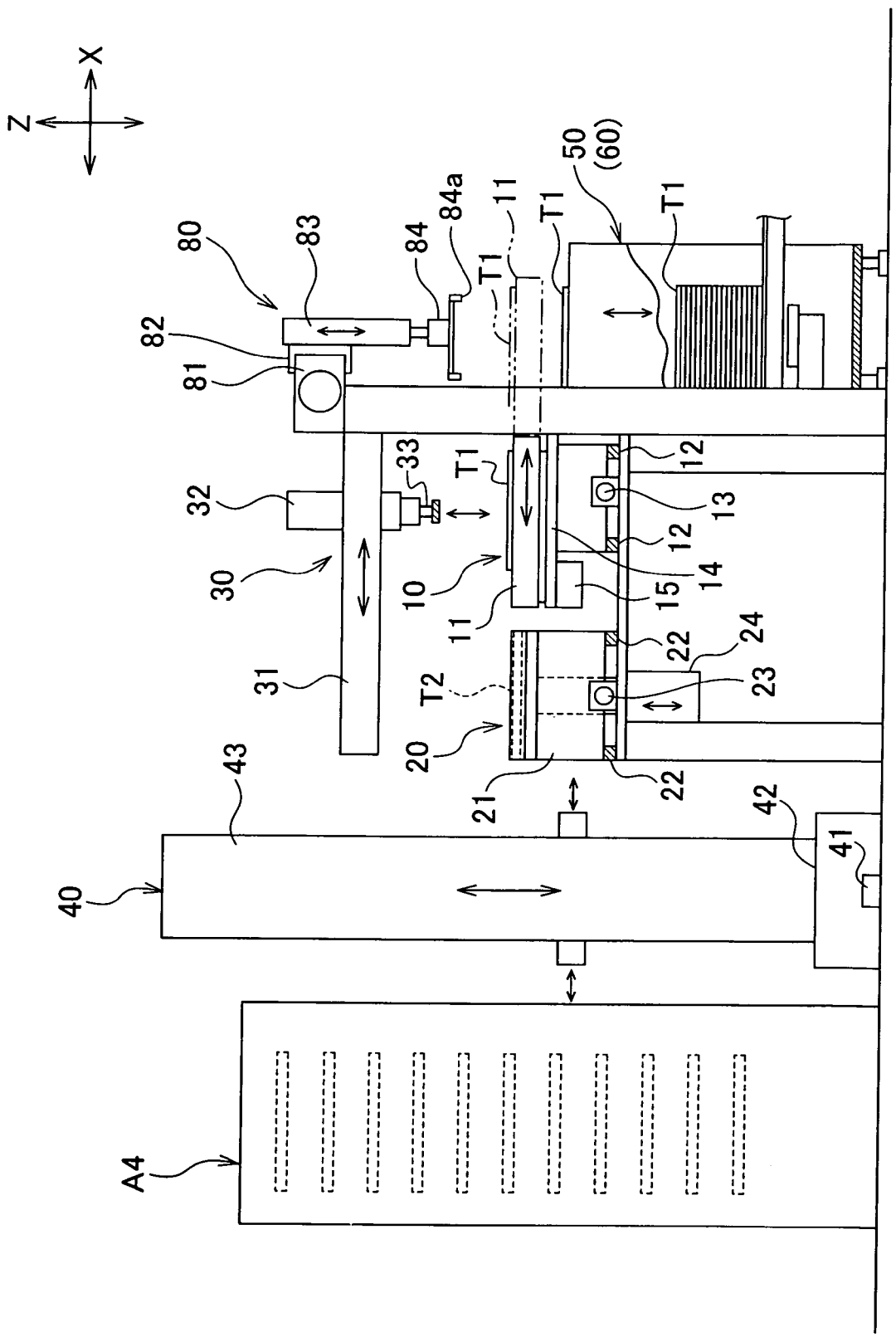
FIG. 3 is a side view of the work handling apparatus of FIG. 1.

In the transfer areas A1 and A2, as shown in FIG. 1 through FIG. 3, a general-purpose tray holding unit 10 which can move in the left and right direction Y while holding general-purpose trays T1 that can accommodate works, a processing tray holding unit 20 which is arranged adjacent to the rear side in the front and rear direction X of the general-purpose tray holding unit 10 and can move in the left and right direction Y while holding the processing tray T2 which carries works in and out of the processing area A4, and work transfer units 30 which can move in the front and rear direction X and the vertical direction Z so as to transfer works between the general-purpose tray T1 and the processing tray T2, are provided.

The general-purpose tray holding unit 10, the processing tray holding unit 20, and the work transfer units 30 constitute a work transfer mechanism, and two work transfer mechanisms are arranged in the left and right direction Y in the transfer areas A1 and A2, respectively.

The general-purpose tray holding unit 10 is formed by, as shown in FIG. 1 and FIG. 3 through FIG. 6, a table 11 which has a substantially rectangular contour and holds a plurality (herein, three) of general-purpose trays T1 on the upper surface, guide rails 12 which support the table 11 movably in the left and right direction Y, a drive mechanism 13 which moves the table 11 in the left and right direction Y, a slider 14 which moves the table 11 in the front and rear direction X, a drive mechanism 15 which drives the slider 14 in the front and rear direction X, and so on.

Herein, as the drive mechanism 13, a feed screw mechanism or the like which includes a drive source capable of performing position control such as a stepping motor or a servo motor, a ball screw (lead screw) to be driven and rotated by the drive source, and a nut which is provided on the table 11 and is screwed with the ball screw is applied. As the drive mechanism 15, similar to the drive mechanism 13, a feed screw mechanism which includes a drive source capable of performing position control such as a stepping motor or a servo motor, a ball screw (lead screw) to be driven and rotated by the drive source, and a nut which is provided on the slider 14 and is screwed with the ball screw, or a hydraulic or pneumatic extensible actuator or the like is applied.

Specifically, to transfer a work between the general-purpose tray T1 held by the general-purpose tray holding unit 10 and the processing tray T2 held by the processing tray holding unit 20, the table 11 is driven at predetermined pitches in the left and right direction Y by the drive mechanism 13, and the work to be transferred or an accommodating portion T1a accommodating the work to be transferred is positioned just below the work transfer unit 30 in the left and right direction Y.

To supply or retrieve the general-purpose tray T1, the slider 14 is driven in the front and rear direction X by the drive mechanism 15 so as to move between a rear position at which work transfer is performed by the work transfer unit 30 and a front position for supplying or retrieving a general-purpose tray T1.

The processing tray holding unit 20 is formed by, as shown in FIG. 1 and FIG. 3 through FIG. 6, a table 21 which has a substantially rectangular contour and holds a processing tray T2 on the upper surface, guide rails 22 which support the table 21 movably in the left and right direction Y, a drive mechanism 23 which moves the table 21 in the left and right direction Y, an elevating mechanism 24 which moves the table 21 in the vertical direction Z, and so on.

Herein, as the drive mechanism 23, a feed screw mechanism or the like which includes a drive source capable of performing position control such as a stepping motor or a servo motor, a ball screw (lead screw) to be driven and rotated by the drive source, and a nut which is provided on the table 21 and is screwed with the ball screw is applied. As the elevating mechanism 24, a hydraulic or pneumatic extensible actuator or the like which can position the table 21 at a desired height in the vertical direction Z is applied.

Specifically, to transfer a work between the general-purpose tray T1 held by the general-purpose tray holding unit 10 and the processing tray T2 held by the processing tray holding unit 20, the table 21 is driven at predetermined pitches in the left and right direction Y by the drive mechanism 23 to position the work to be transferred or the accommodating portion T2a which accommodates the work to be transferred just below the work transfer unit 30 in the left and right direction Y.

To transfer the processing tray T2 to the processing tray delivery unit 40, after the processing tray delivery unit 40 described later holds the processing tray T2, the table 21 is lowered and withdrawn to a predetermined height by the elevating mechanism 24, and on the other hand, to receive the processing tray T2 from the processing tray delivery unit 40, after the processing tray delivery unit 40 described later positions the processing tray T2 at a predetermined position, the table 21 is raised to a predetermined height by the elevating mechanism 24 to hold (receive) the processing tray.

The work transfer units 30 are provided two each in the transfer areas A1 and A2, respectively, as shown in FIG. 1 through FIG. 3 and FIG. 7A through FIG. 7C, and are formed by a guide mechanism 31 which extends in the front and rear direction X above the transfer area A1 or A2, an elevating mechanism 32 which is supported movably in the front and rear direction X with respect to the guide mechanism 31 and elevates in the vertical direction Z, a holding head 33 which is provided on the lower end of the elevating mechanism 32 and can hold a work, and so on.

Herein, as the guide mechanism 31, a feed screw mechanism or the like which includes a drive source capable of performing position control such as a stepping motor or a servo motor that moves the elevating mechanism 32 while guiding it in the front and rear direction X, a ball screw (lead screw) to be driven and rotated by the drive source, and a nut which is provided in the elevating mechanism 32 and is screwed with the ball screw is applied, and as the elevating mechanism 32, a feed screw mechanism which includes a drive source capable of performing position control such as a stepping motor or a servo motor, a ball screw (lead screw) to be driven and rotated by the drive source, and a nut which is provided in the elevating mechanism 32 and is screwed with the ball screw, or a hydraulic or pneumatic extensible actuator or the like is applied, and as the holding head 33, an adsorbing pad which adsorbs a work, grasping pieces which grasp a work from both sides, or the like is applied.

Specifically, to transfer a work between the general-purpose tray T1 and the processing tray T2, the elevating mechanism 32 is moved arbitrarily in the front and rear direction X by the guide mechanism 31 and positioned at a predetermined position, and at this position, lowers and holds a work by the holding head 33, and then elevates again and is positioned by the guide mechanism 31 to a position just above the accommodating portion T2a or T1a of the processing tray T2 or the general-purpose tray T1 onto which the work is to be transferred, and then lowers at this position and accommodates the work in the accommodating portion T2a or T1a.

As described above, to transfer an unprocessed work from the general-purpose tray T1 onto the processing tray T2 and to transfer a processed work for which predetermined processing has been completed in the processing area A4 from the processing tray T2 onto the general-purpose tray T1, the general-purpose tray holding unit 10 and the processing tray holding unit 20 are moved in the left and right direction Y arbitrarily according to predetermined accommodation pitches and positioned at a predetermined taking out position and an accommodating position, and the work transfer unit 30 moves in the front and rear direction X to convey the work between the general-purpose tray T1 and the processing tray T2 and moves in the vertical direction Z and takes out the work and accommodates the work to transfer the work between the general-purpose tray T1 and the processing tray T2. Thus, the general-purpose tray holding unit 10 and the processing tray holding unit 20 move in the left and right direction Y arbitrarily and always position a work to be taken out or accommodated below the work transfer unit 30 in the left and right direction Y, and the work transfer unit 30 moves in the vertical direction Z and the front and rear direction X to transfer the work, so that the work taken out from the accommodating portion T1a or T2a of the tray T1 or T2 only moves within the XZ plane, and therefore, the work can be moved at a high speed, and the transfer operation can be increased in speed. For each of the general-purpose tray holding unit 10, the processing tray holding unit 20, and the work transfer units 30, one moving mechanism which moves in only one direction within a plane (the left and right direction Y or the front and rear direction X) is employed, so that a mechanical error is decreased and highly accurate positioning is realized. As a result, when transferring a work between the general-purpose tray holding unit 10 and the processing tray holding unit 20, a holding failure or an accommodation failure at the time of work taking out or accommodation can be prevented, and a work can be accurately transferred.

In each of the transfer areas A1 and A2, two work transfer units 30 are arranged in the left and right direction Y, so that when the general-purpose tray holding unit 10 holds a general-purpose unprocessed work trays T1 which accommodates unprocessed works and a general-purpose processed work trays T1 which accommodates processed works, while an unprocessed work is transferred from the general-purpose unprocessed work trays T1 onto the processing tray T2 by one work transfer unit 30, a processed work can be transferred from the processing tray T2 onto the general-purpose processed work trays T1 by the other work transfer unit 30. That is, transfer of an unprocessed work and transfer of a processed work can be performed concurrently, so that the time necessary for transferring can be made shorter than in the case where the works are transferred at different times.

In the processing tray delivery area A3, as shown in FIG. 1 and FIG. 3, a processing tray delivery unit 40 is disposed.

Figure 9:
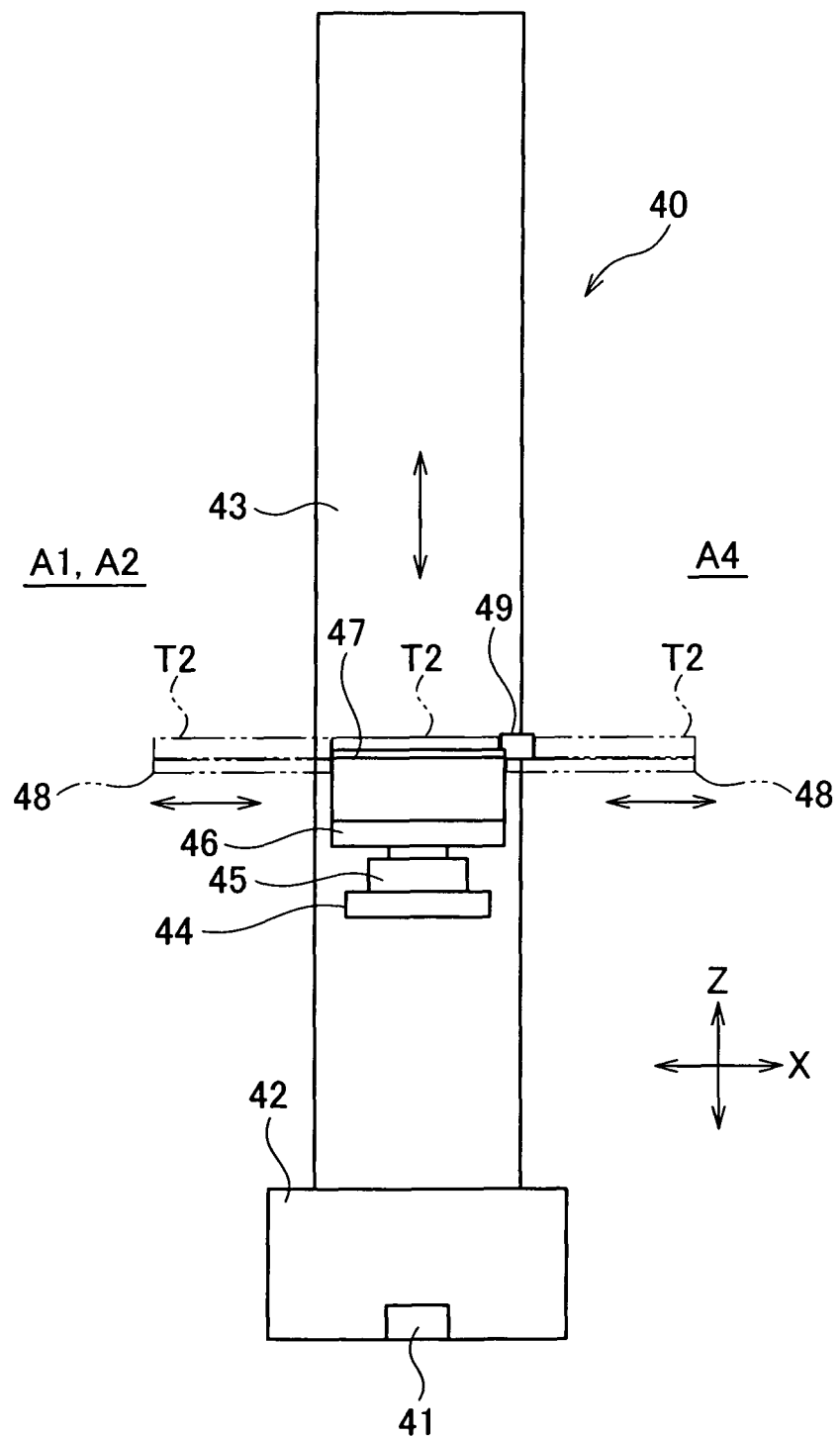
FIG. 9 is a side view of a processing tray delivery unit forming a part of the work handling apparatus of FIG. 1.

The processing tray delivery unit 40 is formed by, as shown in FIG. 8A, FIG. 8B, and FIG. 9, a guide rail 41 extending in the left and right direction Y, a movable base 42 movable on the guide rail 41, an elevating mechanism 43 provided upright on the movable base 42, an elevating member 44 which is elevated in the vertical direction Z by the elevating mechanism 43, a rotating mechanism 45 provided on the elevating member 44, a counter 46 provided on the rotating mechanism 45, a pair of guide frames 47 provided on the counter 46, a slider mechanism 48 provided on the counter 46, a grasping member 49 which grasps the processing tray T2, and so on.

Herein, the movable base 42 is moved by a drive mechanism installed therein, in the left and right direction Y along the guide rail 41, and positions the processing tray T2 that is carried thereon or the counter 46 which does not carry the processing tray T2 into the transfer area A1 or the transfer area A2, and further positions it into a corresponding processing area when a plurality of processing areas are included in the processing area A4.

The elevating mechanism 43 positions the elevating member 44 at a desired height in the vertical direction Z so as to position the processing tray T2 at a desired height, and a hydraulic or pneumatic extensible actuator, a feed screw mechanism, or the like is applied thereto. The rotating mechanism 45 rotates so as to adjust the orientation of the processing tray T2 in the horizontal plane (XY plane), and a motor and gear mechanism, etc., are applied thereto. The pair of guide frames 47 carries the processing tray T2 and positions the processing tray T2 by restricting it by sandwiching it from both sides. The slider mechanism 48 slides (extends) to the region of the transfer area A1 or A2 (processing tray holding unit 20) or the region of the processing area A4 to transfer or receive the processing tray T2. The grasping member 49 moves integrally with the slider mechanism 48 and grasps and holds the edge of the processing tray T2.

That is, this processing tray delivery unit 40 delivers the processing tray T2 between the processing tray holding unit 20 and the processing area A4, so that smooth transition to the processing step after the work transfer step is possible, and a processed work can be smoothly returned to the processing tray holding unit 20. Further, when a plurality of processing areas A4 are provided, the processing tray T2 can be smoothly delivered between an arbitrarily selected processing area and the processing tray holding unit 20.

In the processing area A4, inspection areas A4' and A4" as a plurality of processing areas in which predetermined inspections are applied to works accommodated in the processing tray T2 are arranged in the left and right direction Y. In the inspection areas A4' and A4", when the works are semiconductor chips, various inspection units which perform a continuity check or operation check, etc., are disposed.

In the general-purpose tray supplying area A5, as shown in FIG. 1 through FIG. 3, a plurality (herein, three) of general-purpose tray supplying units 50 are disposed.

Figure 10A:
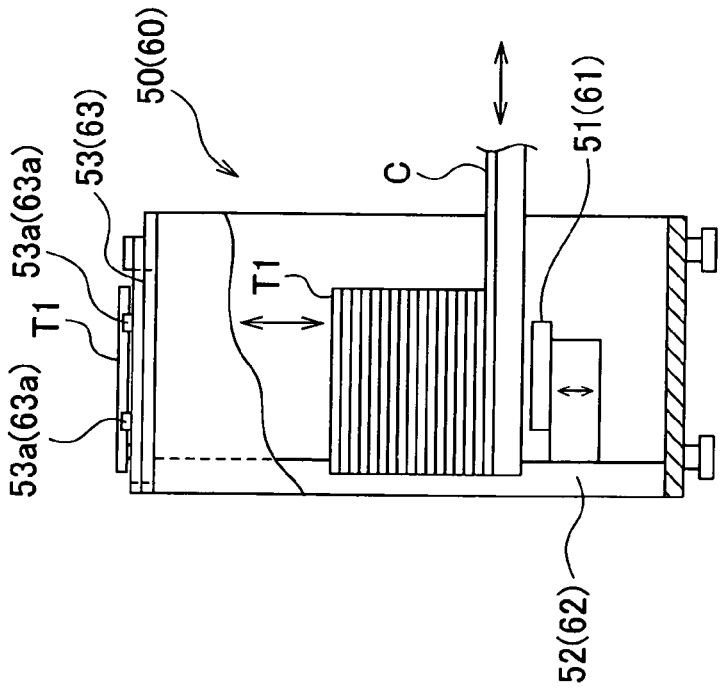
FIG. 10A, FIG. 10B, and FIG. 10C are a side view, a front view, and a plan view of a general-purpose tray supplying unit and a general-purpose tray retrieving unit forming a part of the work handling apparatus of FIG. 1, respectively.
Figure 10B:
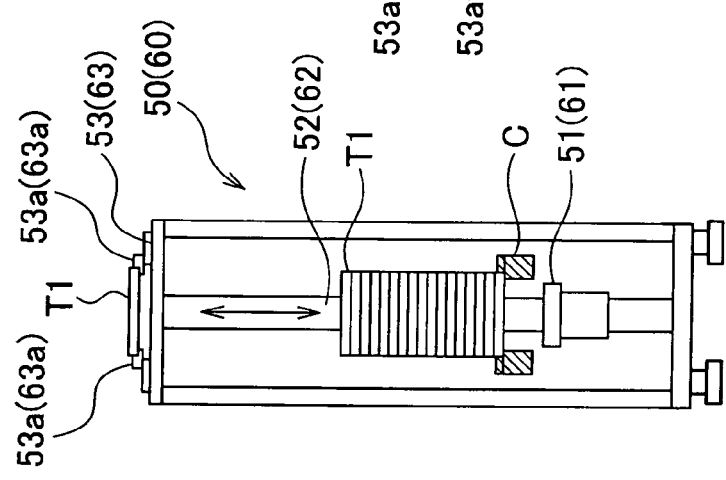
Figure 10C:
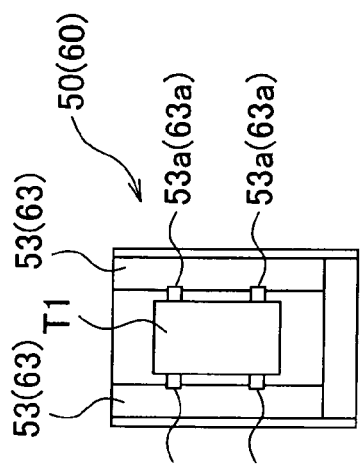

The general-purpose tray supplying unit 50 is formed by, as shown in FIG. 10A through FIG. 10C, a table 51 on which general-purpose trays T1 are placed, an elevating mechanism 52 which elevates the table 51 in the vertical direction Z, and a holding mechanism 53 including holding pieces 53a which hold the general-purpose tray T1 by sandwiching it at the supply position on the upper side.

Into the general-purpose tray supplying unit 50, to carry-in the general-purpose tray T1, a conveyor C is drawn horizontally at a position higher than the table 51 positioned at the lowest end.

Herein, the elevating mechanism 52 is for arbitrarily elevating and positioning the table 51 at a predetermined height, for example, at a supply position for supplying a general-purpose tray T1 to a general-purpose tray transfer unit 80 described later, at a supply standby position slightly lower than the supply position, and at a withdrawn position at which the table is lowered than the conveyor C and withdrawn for carrying-in, and a hydraulic or pneumatic extensible actuator, a feed screw mechanism, or the like is applied thereto. The holding mechanism 53 enables the table 51 to lower (for releasing of the topmost general-purpose tray T1 of the general-purpose trays T1 carried on the table 51) by holding the general-purpose trays T1 positioned at the supply position by the table 51 and the elevating mechanism 52 by the holding pieces 53a.

That is, in the state that the table 51 is at the withdrawn position, when general-purpose trays T1 stacked are carried-in by the conveyor C, the elevating mechanism 52 actuates and the table 51 carries the general-purpose trays T1 and rises so as to position the topmost general-purpose tray T1 at the supply position.

Then, the holding mechanism 53 grasps the topmost general-purpose tray T1 by the holding pieces 53a and holds it at the supply position. Thereafter, the elevating mechanism 52 actuates and the table 51 lowers to the supply standby position while carrying the remaining general-purpose trays T1 and stands by.

Then, when the general-purpose tray transfer unit 80 described later receives the general-purpose tray T1 held at the supply position, the elevating mechanism 52 actuates and the table 51 rises and positions the topmost general-purpose tray T1 among the stacked general-purpose trays T1 at the supply position.

Then, the holding mechanism 53 grasps and holds the topmost general-purpose tray T1, and the table 51 lowers to the supply standby position and stands by there while carrying the remaining general-purpose trays T1. In the general-purpose tray supplying unit 50, this operation is repeated.

In this general-purpose tray supplying area A5, three general-purpose tray supplying units 50 are disposed, so that, for example, two general-purpose tray supplying units 50 supply general-purpose trays T1 accommodating unprocessed works and one general-purpose tray supplying unit 50 supplies an empty general-purpose tray T1 accommodating no works to transfer processed works onto it.

The general-purpose tray supplying units 50 can be increased and decreased according to processing. For example, when the work changing processing increases, the number of general-purpose tray supplying units 50 may be increased to more than three, and on the other hand, when the work changing processing is decreased or a general-purpose tray supplying unit 50 malfunctions, it may be separated from the general-purpose tray supplying area A5 and the number of general-purpose tray supplying units 50 may be decreased. Herein, the general-purpose tray supplying units 50 are increased or decreased according to an instruction from a switch not shown.

In the general-purpose tray retrieving area A6, as shown in FIG. 1 through FIG. 3, a plurality (herein, four) of general-purpose tray retrieving units 60 are disposed.

The general-purpose tray retrieving unit 60 has substantially the same constitution as that of the above-described general-purpose tray supplying unit 50 as shown in FIG. 10A through FIG. 10C, and is formed by a table 61 on which general-purpose trays T1 are placed, an elevating mechanism 62 which elevates the table 61 in the vertical direction Z, a holding mechanism 63 including holding pieces 63a which hold a general-purpose tray T1 by sandwiching it at a retrieving position at the upper side, and so on.

Into the general-purpose tray collecting unit 60, the conveyor C is drawn horizontally at a position higher than the table 61 positioned at the lowest end to carry-out stacked general-purpose trays T1.

Herein, the elevating mechanism 62 arbitrarily elevates and positions the table 61 at a predetermined height, for example, at a retrieving position for retrieving a general-purpose tray T1 from the general-purpose tray transfer unit 80 described later, at a retrieving standby position slightly lower than the retrieving position, and at a withdrawn position at which the table lowers more than the conveyor C and withdraws for carrying-out, and as the elevating mechanism, a hydraulic or pneumatic extensible actuator, a feed screw mechanism, or the like is applied. The holding mechanism 63 enables the table 61 to rise (for joining of the topmost general-purpose tray T1 of the general-purpose trays T1 carried on the table 61) by holding the general-purpose tray T1 positioned at the retrieving position by the table 61 and the elevating mechanism 62 by the holding pieces 63a.

That is, when the general-purpose tray transfer unit 80 described later positions the general-purpose tray T1 at the retrieving position, the holding mechanism 63 receives the general-purpose tray T1 and holds it.

Then, the elevating mechanism 62 actuates and the table 61 rises and joins the topmost general-purpose tray T1 of the stacked general-purpose trays T1 to the general-purpose tray T1 held at the retrieving position and carries it, and at the same time, the holding state of the holding mechanism 63 is released.

Thereafter, the elevating mechanism 62 actuates and the table 61 lowers to and stands by at the retrieving standby position while carrying the general-purpose trays T1.

Then, when a general-purpose tray T1 is transferred again from the general-purpose tray transfer unit 80 described later onto the holding mechanism 63, the table 61 rises and carries the held general-purpose tray T1 and the holding state of the holding mechanism 63 is released, and the table 61 lowers to and stands by at the retrieving standby position again while carrying the general-purpose tray T1. In the general-purpose tray retrieving unit 60, the above-described operation is repeated.

When a predetermined number of general-purpose trays T1 are stacked, the table 6 lowers to the withdrawn position and transfers the general-purpose trays T1 that is carried thereon the conveyor C, and the conveyor C carries out the general-purpose trays T1.

In this general-purpose tray retrieving area A6, four general-purpose tray retrieving units 60 are disposed, so that, for example, two general-purpose tray retrieving units 60 retrieve general-purpose trays T1 accommodating non-defective works satisfying a predetermined inspection among processed works, and the other two general-purpose tray retrieving units 60 retrieve general-purpose trays T1 accommodating defective works that do not satisfy a predetermined inspection among processed works. The general-purpose tray retrieving units 60 can be increased or decreased according to the processing, and are increased and decreased according to an instruction from a switch not shown.

In the general-purpose tray standby area A7, as shown in FIG. 1 and FIG. 2, a placing table 70 is disposed.

The placing table 70 is disposed between the general-purpose tray supplying units 50 and the general-purpose tray retrieving units 60 in the left and right direction Y so as to make a plurality (herein, three) of general-purpose trays T1 placed thereon stand by.

Thus, by providing the general-purpose tray standby area A7, when a general-purpose tray T1 accommodating processed works (non-defective or defective works) is not filled with works, this general-purpose tray T1 can be temporarily placed on the placing table 70 and made to stand by. When an interruption instruction for processing a different type of works is issued, a preceding general-purpose tray T1 is temporarily placed on the placing table 70 and made to stand by, and further, a general-purpose tray T1 to be supplied to the general-purpose tray holding unit 10 or a general-purpose tray T1 to be retrieved from the general-purpose tray holding unit 10 can be temporarily placed on the placing table 70 and made to stand by, and the supplying timing or retrieving timing can be adjusted.

In the general-purpose tray supplying area A5, the general-purpose tray standby area A7, and the general-purpose tray retrieving area A6, as shown in FIG. 1 and FIG. 2, the general-purpose tray transfer unit 80 which moves general-purpose trays T1 in the vertical direction Z and the left and right direction Y is disposed.

The general-purpose tray transfer unit 80 is formed by, as shown in FIG. 11A through FIG. 11C, a guide frame 81 extending in the left and right direction Y above the general-purpose tray supplying area A5, the general-purpose tray standby area A7, and the general-purpose tray retrieving area A6, a slider mechanism 82 which moves in the left and right direction Y along the guide frame 81, two elevating mechanisms 83 which elevate in the vertical direction Z by being held by the slider mechanism 82, holding mechanisms 84 which are elevated in the vertical direction Z by the respective elevating mechanisms 83 and have holding pieces 84a for holding general-purpose trays T1, and so on.

Herein, the slider mechanism 82 moves the elevating mechanisms 83 to a desired position in the left and right direction Y along the guide frame 81, and a hydraulic or pneumatic extensible actuator, a feed screw mechanism, or the like is applied thereto. The elevating mechanisms 83 move the holding mechanisms 84 to desired positions in the vertical direction Z, and hydraulic or pneumatic extensible actuators, feed screw mechanisms, or the like are applied thereto. The holding mechanisms 84 sandwich general-purpose trays T1 from both sides by four holding pieces 84a.

That is, to transfer a general-purpose tray T1 from the general-purpose tray supplying unit 50 onto the general-purpose tray holding unit 10, to transfer a general-purpose tray T1 from the general-purpose tray holding unit 10 onto the general-purpose tray retrieving unit 60, to make a general-purpose tray T1 temporarily stand by in the general-purpose tray standby area A7 from the general-purpose tray supplying unit 50, and to make a general-purpose tray T1 temporarily stand by in the general-purpose tray standby area A7 from the general-purpose tray holding unit 10, the general-purpose tray transfer unit 80 rises while holding the general-purpose tray T by the holding mechanisms 84, and moves to a predetermined position in the left and right direction Y and then lowers, and releases the holding mechanisms 84 and transfers the general-purpose tray T1 at the transfer position.

Thus, the general-purpose tray transfer unit 80 moves in the left and right direction Y and the vertical direction Z within the YZ plane to move the general-purpose tray T1, so that the moving distance (movement path length) for supplying or retrieving a general-purpose tray T1 can be shortened, and accordingly, the apparatus can be consolidated.

The positions for taking out general-purpose trays T1 in the general-purpose tray supplying units 50, the transfer positions (front positions to which the tables 11 move forward) in the general-purpose tray holding units 10, the positions for retrieving general-purpose trays T1 in the general-purpose tray retrieving units 60, and the standby position at which a general-purpose tray T1 is made to temporarily stand by in the standby table 70, are arranged substantially linearly in the left and right direction Y.

Therefore, as a moving mechanism that moves the general-purpose tray transfer unit 80 within a plane, only one moving mechanism which moves the general-purpose tray transfer unit 80 only in the left and right direction Y is provided, and a mechanical error of the moving mechanism can be decreased. Therefore, the general-purpose tray transfer unit 80 can be highly accurately and reliably stopped at a predetermined position, and a general-purpose tray T1 can be taken out from the predetermined position and reliably placed at a predetermined position.

Operations of the entire work handling apparatus will be described. First, when a general-purpose tray T1 accommodating unprocessed works and an empty general-purpose tray T1 accommodating no works are supplied by the general-purpose tray supplying units 50, the general-purpose tray transfer unit 80 holds these general-purpose trays T1 and transfers these onto the general-purpose tray holding unit 10 moved to the front position.

Then, the general-purpose tray holding unit 10 moves to the rear position at which the works are transferred by the work transfer units 30. The processing tray holding unit 20 holds a processing tray T2 accommodating works processed in the previous step.

Subsequently, one work transfer unit 30 transfers works processed in the processing area A4 from the processing tray T2 onto a general-purpose tray T1, and at the same time, the other work transfer unit 30 transfers the unprocessed works onto the processing tray T2 from the general-purpose tray T1.

Herein, when the processed works are transferred onto the general-purpose trays T1, they are classified so that non-defectives satisfying an inspection are accommodated in a general-purpose non-defective tray T1, and defectives that do not satisfy the inspection are accommodated in a general-purpose defective tray T1.

In the above-described transfer operation, the general-purpose tray holding unit 10 and the processing tray holding unit 20 move arbitrarily in the left and right direction Y according to predetermined accommodation pitches to always position the works to be taken out and accommodated below the work transfer units 30, and the work transfer units 30 transfer the works by moving in the vertical direction Z and the front and rear direction Z, so that the works can be moved at a high speed, and the transfer operation can be increased in speed.

By the work transfer unit 30, when transfer of unprocessed works is finished, the processing tray transfer unit 40 delivers the processing tray T2 on the processing tray holding unit 20 to the processing area A4 (inspection area A4' or inspection area A4").

Then, when a predetermined inspection is finished at the processing area A4, the processing tray transfer unit 40 holds a processing tray T2 accommodating processed work and delivers it to the processing holding unit 20.

When the work transfer unit 30 transfers processed works onto a general-purpose tray T1, the general-purpose tray holding unit 10 moves to the front position and the general-purpose tray transfer unit 80 holds this general-purpose tray T1 and transfers it onto the general-purpose tray retrieving unit 60.

In the general-purpose tray retrieving unit 60, when a predetermined amount of general-purpose trays T1 accommodating processed works are stacked, the general-purpose trays T1 are carried out via the conveyor C.

Herein, it is also allowed that a general-purpose tray T1 that is not filled with processed works is made to temporarily stand by in the general-purpose tray standby area A7 before being transferred to the general-purpose tray retrieving unit 60, and is delivered onto the general-purpose tray holding unit 10 again and after being completely filled with works, delivered to the general-purpose tray retrieving unit 60.

When an interruption instruction for processing a different type of works is issued, a different processing tray T2 is supplied onto the processing tray holding unit 20, and the existing general-purpose trays T1 on the general-purpose tray holding unit 10 are made to temporarily stand by in the general-purpose tray standby area A7. Then, a general-purpose tray T1 accommodating works of a type corresponding to the instruction or a new empty general-purpose tray T1 accommodating no works is supplied onto the general-purpose tray holding unit 10 and the same transfer and processing are performed. It is also allowed that only a general-purpose tray T1 accommodating processed works is made to stand by in the standby area A7.

Thus, when a general-purpose tray T1 accommodating processed works is not filled, this general-purpose tray T1 can be made to temporarily stand by in the general-purpose tray standby area A7, and when an interruption instruction for processing a different type of works is issued, preceding general-purpose trays T1 can be made to temporarily standby in the general-purpose tray standby area A7, and further, a general-purpose tray T1 to be supplied to the general-purpose tray holding unit 10 or a general-purpose tray T1 to be retrieved from the general-purpose tray holding unit 10 can be made to temporarily stand by in the general-purpose tray standby area A7 and the supplying timing or the retrieving timing can be adjusted.

Further, in the work handling apparatus, two work transfer mechanisms each constituted by the general-purpose tray holding unit 10, the processing tray holding unit 20, and two work transfer units 30 are provided and arranged in the left and right direction Y, so that works can be successively transferred in a short time, the total time necessary for handling the works can be shortened, and the productivity can be improved.

According to the above-described constitution, when predetermined processing is interrupted, in the two work transfer mechanisms, uncompleted general-purpose trays T1 that works have not been completely accommodated in or transferred onto is produced. In this case, the uncompleted general-purpose tray T1 held in one work transfer mechanism is transferred onto the other work transfer mechanism so that works are accommodated (transferred) in one general-purpose tray T1. At this time, general-purpose trays T1 other than the one general-purpose tray T1 accommodating the works are temporarily moved to the standby area A7.

In detail, for example, a case where the two work transfer mechanisms include an uncompleted general-purpose tray T1 accommodating non-defective works and an uncompleted general-purpose tray T1 accommodating defective works is described. First, the general-purpose tray holding units 10 move to the front positions for supplying or retrieving general-purpose trays T1.

Subsequently, the general-purpose tray transfer unit 80 takes-out the uncompleted general-purpose tray T1 that accommodates defective works and is held by one general-purpose tray holding unit 10 and transfers it into the standby area A7 (placing table 70).

Subsequently, the general-purpose tray transfer unit 80 takes-out the uncompleted general-purpose tray T1 that accommodates non-defective works and that is held by the other general-purpose tray holding unit 10 and transfers it to the placing position of one general-purpose tray holding unit 10 (position at which the uncompleted general-purpose tray T1 accommodating defective works had been held). Thereby, one general-purpose tray holding unit 10 holds two uncompleted general-purpose trays T1 accommodating non-defective works. In this state, one general-purpose tray holding unit 10 moves to the rear position, and by cooperative operations of this one general-purpose tray holding unit 10 and the work transfer unit 30, works are transferred from one general-purpose tray T1 onto empty accommodating portions T1a of the other general-purpose tray T1. Then, when the other general-purpose tray T1 is filled with non-defective works, this transfer operation is completed. The work transfer onto the uncompleted general-purpose tray T1 is completed when either of the uncompleted general-purpose trays T1 is completely filled with works or works to be transferred run out.

When this transfer is completed, one general-purpose tray holding unit 10 moves the general-purpose tray T1 filled with works to the front position, and the general-purpose tray transfer unit 80 transfers this general-purpose tray T1 onto the general-purpose tray retrieving unit 60.

On the other hand, the uncompleted general-purpose tray T1 that accommodates defective works and stands by in the standby area A7 is taken-out from the standby area A7 by the general-purpose tray transfer unit 80 and is transferred to the placing position of the other general-purpose tray holding unit 10 (position at which the uncompleted general-purpose tray T1 accommodating non-defective works had been held). Thereby, the other general-purpose tray holding unit 10 holds two uncompleted general-purpose trays T1 accommodating defective works. In this state, the other general-purpose tray holding unit 10 moves to the rear position, and by cooperative operations of the other general-purpose tray holding unit 10 and the work transfer unit 30, works are transferred from one general-purpose tray T1 onto empty accommodating portions T1a of the other general-purpose tray T1. Subsequent operations are the same as the transfer of the non-defective works, so that description thereof is omitted.

Thus, uncompleted general-purpose trays T1 in which works are not completely accommodated are collectively placed on the respective general-purpose tray holding units 10, and work transfer is performed by cooperation with the respective work transfer units 30, so that the number of uncompleted general-purpose trays T1 can be reduced to one, and efficient processing is realized.

Herein, the case where a general-purpose tray T1 that is not to be processed is moved to and made to temporarily stand by in the standby area A7 is shown, however, without limiting to this method, it is also allowed that, the general-purpose tray transfer unit 80 have two holding mechanisms 84, so that the general-purpose tray T1 that is not to be processed is temporarily held and made to stand by in one holding mechanism 84 instead of the standby area A7. By using and operating two transfer areas A1 and A2 substantially concurrently instead of using the standby area A7, for example, in one transfer area A1, work transfer is performed between uncompleted general-purpose trays T1 for non-defectives which are not filled with processed works, and in the other transfer area A2, work transfer is performed between uncompleted general-purpose trays T1 for defectives which are not filled with processed works, whereby the time for transferring the works onto one general-purpose tray T1 can be shortened, and efficient processing is realized.

Figure 12:
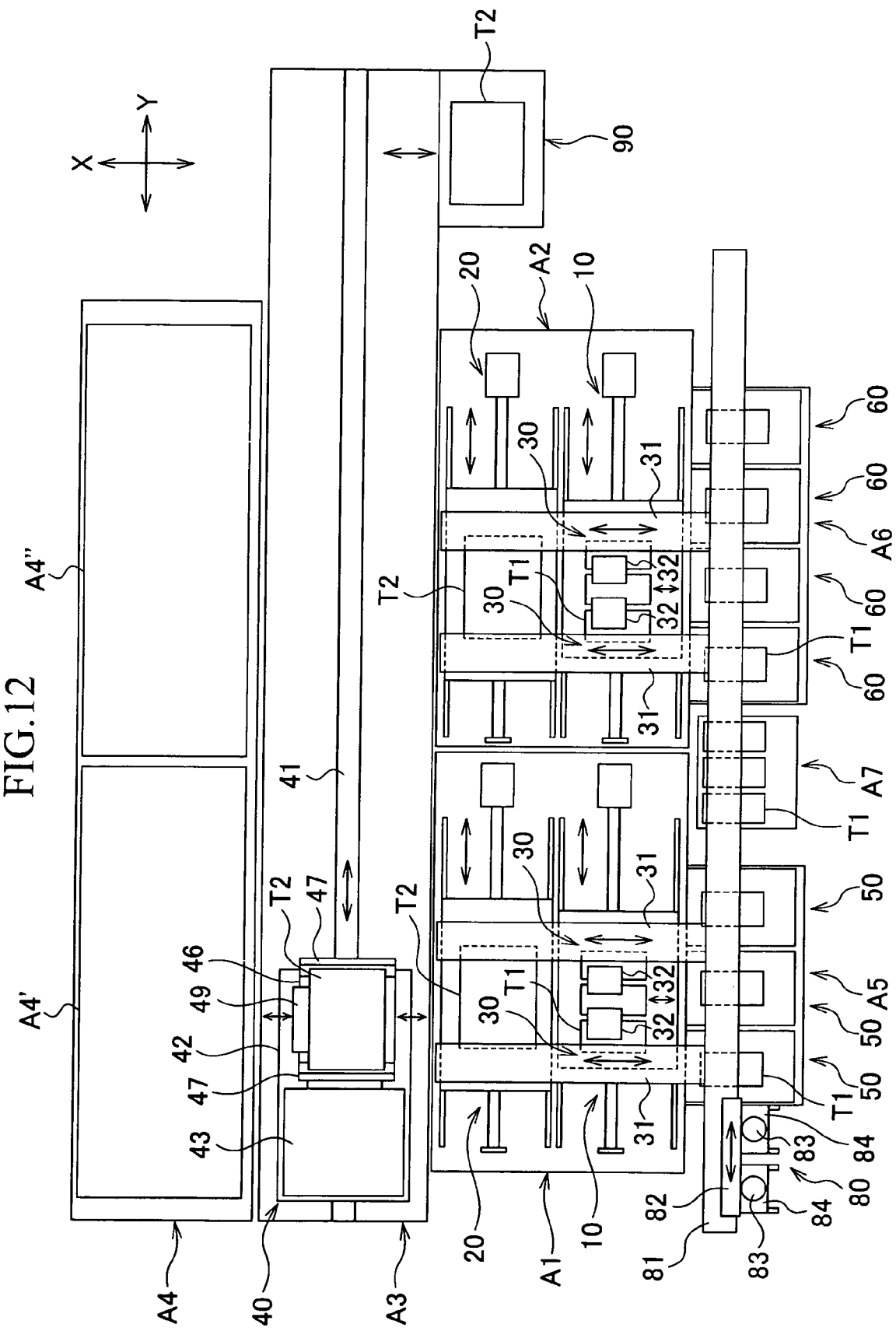
FIG. 12 is a plan view showing another embodiment of the work handling apparatus of the present invention.

FIG. 12 is a plan view showing another embodiment of the work handling apparatus of the present invention. In this embodiment, as shown in FIG. 12, a general-purpose tray supplying and retrieving unit 90 which supplies or retrieves a processing tray T2 to or from the processing tray transfer unit 40 is provided.

Therefore, when the processing area A4 consists of a plurality of processing areas (inspection areas A4' and A4''), a required number of processing trays T2 can be supplied by the processing tray supplying and retrieving unit 90. In addition, when there is a processing area that pauses (inspection area A4' or inspection area A4''), the processing tray T2 can be retrieved accordingly, and further, when a processing tray T2 is maintained and inspected, it can be easily taken out.

As described above, according to the work handling apparatus of the present invention, while realizing simplification of the structure, consolidation of the mechanisms, downsizing as a whole of the apparatus, space-saving of the installation area, and shortening of the time necessary for transferring works, various processing such as tests, inspections, measurements, working, and assembly, etc., can be applied to works such as semiconductor chips, substrates, and other electronic components, and the productivity can be improved.

INDUSTRIAL APPLICABILITY

As described above, as well as the field of semiconductor manufacturing, the work handling apparatus of the present invention is effective in any other field such as automobile or automobile parts production lines, electronics or electronics parts production lines, and other machinery or electronic component-related fields as long as the field requires transfer of works between general-purpose trays T1 and processing trays T2 when various processing is applied to works.

What is claimed is:

1. A work handling apparatus for handling work between a general-purpose tray supplying area where a general-purpose tray for accommodating work is supplied and a processing area where work is processed, the work handling apparatus comprising:

a general-purpose tray holding unit that is arranged between the general-purpose tray supplying area and the processing area and adjacent to the general-purpose tray supplying area to hold the general-purpose tray, the general-purpose tray holding unit including a first drive mechanism for moving the general-purpose tray in a first horizontal direction and a second drive mechanism for moving the general-purpose tray in a second horizontal direction perpendicular to the first horizontal direction;

a general-purpose tray transfer unit that is arranged above the general-purpose tray supplying area to transfer the general-purpose tray between the general-purpose tray supplying area and the general-purpose tray holding unit, the general-purpose tray transfer unit including a third drive mechanism for moving the general-purpose tray in the first horizontal direction and a first elevation mechanism for elevating the general-purpose tray in a vertical direction;

a processing tray holding unit that is arranged between the general-purpose tray holding unit and the processing area and adjacent to the general-purpose tray holding unit to hold a processing tray which carries work in and out of the processing area, the processing tray holding unit including a fourth drive mechanism for moving the processing tray in the first horizontal direction and a second elevation mechanism for elevating the processing tray in the vertical direction; and a first work transfer unit that is arranged above the general-purpose tray holding unit and the processing tray holding unit to transfer work between the general-purpose tray and the processing tray, the first work transfer unit including a fifth drive mechanism for moving work in the second horizontal direction and a third elevation mechanism for elevating work in the vertical direction.

2. The work handling apparatus of claim 1, further comprising a processing tray transfer unit that is arranged between the processing tray holding unit and the processing area to transfer the processing tray between the processing tray holding unit and the processing area, the processing tray transfer unit including a sixth drive mechanism for moving the processing tray in the first horizontal direction, a seventh drive mechanism for moving the processing tray in the second horizontal direction, and a fourth elevation mechanism for elevating the processing tray in the vertical direction.

3. The work handling apparatus of claim 2, wherein
the seventh drive mechanism of the processing tray transfer unit transfers the processing tray between the processing tray holding unit and the processing area, and
the processing tray transfer unit further includes an eighth drive mechanism for rotating the seventh drive mechanism about a vertical axis.

4. The work handling apparatus of claim 1, further comprising a second work transfer unit that is arranged above the general-purpose tray holding unit and the processing tray holding unit to transfer work between the general-purpose tray and the processing tray, the first work transfer unit including a sixth drive mechanism for moving work in the second horizontal direction and a fourth elevation mechanism for elevating work in the vertical direction,
wherein the second work transfer unit is spaced apart from the first work transfer unit in the first horizontal direction.

5. The work handling apparatus of claim 4, wherein each of the work transfer units transfers work from the general-purpose tray holding unit to the processing tray holding unit.

6. The work handling apparatus of claim 1, wherein the work handling apparatus conveys a plurality of general-purpose trays,
wherein the processing area includes an inspection area in which a predetermined inspection is applied to work, and some of the plurality of general-purpose trays are used as a general-purpose non-defective tray for accommodating work satisfying the predetermined inspection and a remainder of the plurality of general-purpose work trays are used as a general-purpose defective tray for accommodating work that does not satisfy the predetermined inspection.

7. The work handling apparatus of claim 1, wherein the general-purpose tray holding unit is movable in the second horizontal direction between a first position at which the work is transferred by the work transfer units and a second position for supplying or retrieving the general-purpose tray, and
wherein there is provided along another side of the general-purpose tray holding unit in the second horizontal direction a general-purpose tray supplying unit which supplies the general-purpose tray accommodating work and an empty general-purpose tray accommodating no work, the general-purpose tray retrieving unit which retrieves the general-purpose tray held by the general-purpose tray holding unit, and a general-purpose tray transfer unit which transfers the general-purpose tray between the general-purpose tray supplying unit and the general-purpose tray holding unit and between the general-purpose tray holding unit and the general-purpose tray retrieving unit.

8. The work handling apparatus of claim 7, wherein the general-purpose tray transfer unit is formed so as to hold a plurality of general-purpose trays.

9. The work handling apparatus of claim 8, wherein
the general-purpose tray supplying unit and the general-purpose tray retrieving unit are arranged in the first horizontal direction, and
the general-purpose tray transfer unit is formed to be movable in the first horizontal direction and in the vertical direction.

10. The work handling apparatus of claim 9, further comprising a general-purpose tray standby area in which a general-purpose tray is made to temporarily stand by, the general-purpose tray standby area being provided in a movement range of the general-purpose tray transfer unit.

11. The work handling apparatus of claim 1, wherein the general-purpose tray holding unit includes a table holding the plurality of general-purpose trays on an upper surface of the table, a guide rail supporting the table movably in the first horizontal direction, and a drive mechanism moving the table at predetermined pitches in the first horizontal direction.

12. The work handling apparatus of claim 11, wherein the processing tray holding unit includes a table holding the processing tray on an upper surface of the table, a guide rail supporting the table movably in the first horizontal direction, and a drive mechanism moving the table at predetermined pitches in the first horizontal direction.

13. The work handling apparatus of claim 11, wherein the general-purpose tray holding unit further includes a slider configured to support the table thereon and to be movable in the second horizontal direction, and another drive mechanism moving the slider in the second horizontal direction.

14. A work handling apparatus for handling work between a general-purpose tray supplying area where a general-purpose tray for accommodating work is supplied and a processing area where work is processed, comprising:
a general-purpose tray holding unit that is arranged between the general-purpose tray supplying area and the processing area and adjacent to the general-purpose tray supplying area to hold the general-purpose tray, the general-purpose tray holding unit including a first drive mechanism for moving the general-purpose tray in a first horizontal direction and a second drive mechanism for moving the general-purpose tray in a second horizontal direction perpendicular to the first horizontal direction;
a general-purpose tray transfer unit that is arranged above the general-purpose tray supplying area to transfer the general-purpose tray between the general-purpose tray supplying area and the general-purpose tray holding unit, the general-purpose tray transfer unit including a third drive mechanism for moving the general-purpose tray in the first horizontal direction and a first elevation mechanism for elevating the general-purpose tray in a vertical direction;
a processing tray holding unit that is arranged between the general-purpose tray holding unit and the processing area and adjacent to the general-purpose tray holding unit to hold a processing tray which carries work in and out of the processing area, the processing tray holding unit including a fourth drive mechanism for moving the processing tray in the first horizontal direction and a second elevation mechanism for elevating the processing tray in the vertical direction;
a first work transfer unit that is arranged above the general-purpose tray holding unit and the processing tray holding unit to transfer work between the general-purpose tray and the processing tray, the first work transfer unit including a fifth drive mechanism for moving work in the second horizontal direction and a third elevation mechanism for elevating work in the vertical direction; and a processing tray transfer unit that is arranged between the processing tray holding unit and the processing area to transfer the processing tray between the processing tray holding unit and the processing area, the processing tray transfer unit including a sixth drive mechanism for moving the processing tray in the first horizontal direction, a seventh drive mechanism for moving the processing tray in the second horizontal direction, and a fourth elevation mechanism for elevating the processing tray in the vertical direction, and wherein the seventh drive mechanism of the processing tray transfer unit transfers the processing tray between the processing tray holding unit and the processing area, and the processing tray transfer unit further includes an eighth drive mechanism for rotating the seventh drive mechanism about a vertical axis.

15. The work handling apparatus of claim 14, further comprising a second work transfer unit that is arranged above the general-purpose tray holding unit and the processing tray holding unit to transfer work between the general-purpose tray and the processing tray, the second work transfer unit including a ninth drive mechanism for moving work in the second horizontal direction and a fifth elevation mechanism for elevating work in the vertical direction, wherein the second work transfer unit is spaced apart from the first work transfer unit in the first horizontal direction.

16. The work handling apparatus of claim 15, wherein each of the work transfer units transfers work from the general-purpose tray holding unit to the processing tray holding unit.

* * * * *